US010515788B2

(12) United States Patent
Pan et al.

(10) Patent No.: US 10,515,788 B2
(45) Date of Patent: *Dec. 24, 2019

(54) SYSTEMS AND METHODS FOR INTEGRATED RESPUTTERING IN A PHYSICAL VAPOR DEPOSITION CHAMBER

(71) Applicant: Taiwan Semiconductor Manufacturing Company, Ltd., Hsinchu (TW)

(72) Inventors: Shing-Chyang Pan, Hsinchu (TW); Ching-Hua Hsieh, Hsinchu (TW); Ming-Hsing Tsai, Chu-Pei (TW); Syun-Ming Jang, Hsin-Chu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/883,737

(22) Filed: Jan. 30, 2018

(65) Prior Publication Data

US 2018/0158658 A1    Jun. 7, 2018

Related U.S. Application Data

(63) Continuation of application No. 14/162,507, filed on Jan. 23, 2014, now Pat. No. 9,887,072.

(51) Int. Cl.
*H01J 37/34* (2006.01)
*C23C 14/04* (2006.01)
(Continued)

(52) U.S. Cl.
CPC ........ *H01J 37/3447* (2013.01); *C23C 14/046* (2013.01); *C23C 14/352* (2013.01); *C23C 14/5873* (2013.01); *H01J 37/3405* (2013.01)

(58) Field of Classification Search
CPC .... H01J 37/3447; H01J 37/3405; H01J 37/34; H01J 37/3438; C23C 14/046; C23C 14/352; C23C 14/5873
(Continued)

(56) References Cited

U.S. PATENT DOCUMENTS 5,804,046 A * 9/1998 Sawada ................ C23C 14/564
                                                     118/301
6,692,617 B1    2/2004 Fu et al.
(Continued)

FOREIGN PATENT DOCUMENTS

EP    0 703 598 A1    3/1996
JP    406010125 A     1/1994
(Continued)

*Primary Examiner* — Rodney G McDonald
(74) *Attorney, Agent, or Firm* — Haynes and Boone, LLP

(57) ABSTRACT

Physical vapor deposition systems are disclosed herein. An exemplary physical vapor deposition system includes a target, a collimator, a power source system, and a control system. The power source system is configured to supply power to the collimator and the target. The control system is configured to control the power source system, such that the collimator is bombarded with noble gas ions during a sputtering process and the target is bombarded with metal ions during a re-sputtering process, wherein the collimator functions as a sputtering target during the sputtering process and as the collimator during the re-sputtering process.

20 Claims, 2 Drawing Sheets

(51) Int. Cl.
*C23C 14/35* (2006.01)
*C23C 14/58* (2006.01)

(58) Field of Classification Search
USPC .......................... 204/192.12, 298.06, 298.11
See application file for complete search history.

(56) References Cited

U.S. PATENT DOCUMENTS

| | | |
|---|---|---|
| 6,755,945 B2 | 6/2004 | Yasar et al. |
| 7,294,242 B1 | 11/2007 | Hashim et al. |
| 2005/0211546 A1 | 9/2005 | Hanawa et al. |
| 2009/0308732 A1 | 12/2009 | Cao et al. |
| 2015/0114823 A1 | 4/2015 | Lee et al. |

FOREIGN PATENT DOCUMENTS

| | | |
|---|---|---|
| TW | 201350601 | 12/2013 |
| WO | WO-2015060942 A1 | 4/2015 |

\* cited by examiner

SYSTEMS AND METHODS FOR INTEGRATED RESPUTTERING IN A PHYSICAL VAPOR DEPOSITION CHAMBER

This is a continuation application of U.S. patent application Ser. No. 14/162,507, filed Jan. 23, 2014, now U.S. Pat. No. 9,887,072, the entire disclosure of which is incorporated herein by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

One commonly used technique employed to form material layers over semiconductor wafers is physical vapor deposition, which includes the technique of sputtering. In sputtering deposition, a plasma is used to excite ions, typically of a noble gas, to facilitate forceful collisions with a target. Atoms of the target are knocked free by the colliding ions and then condense on the exposed surface of a semiconductor wafer forming a thin layer or film of the target material. Some other PVD chambers may also be used in an etching process by exciting ions, noble gases or metal ions, and generating collisions with the layer to be etched on the semiconductor wafer. As the feature size has decreased, providing sputtered material layers with even coverage on the features on a semiconductor wafer has become increasingly difficult.

BRIEF DESCRIPTION OF THE DRAWINGS

Aspects of the present disclosure are better understood by reference to the accompanying figures. It is emphasized that, in accordance with the standard practice in the industry, various features are not drawn to scale. In fact, the dimensions of the various features may be arbitrarily increased or reduced for clarity of discussion.

Aspects of the present disclosure may be best understood by viewing the accompanying figures with reference to the detailed description provided below.

DETAILED DESCRIPTION

The following disclosure provides different embodiments, or examples, for implementing different features of the disclosure. Specific examples of components and arrangements are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
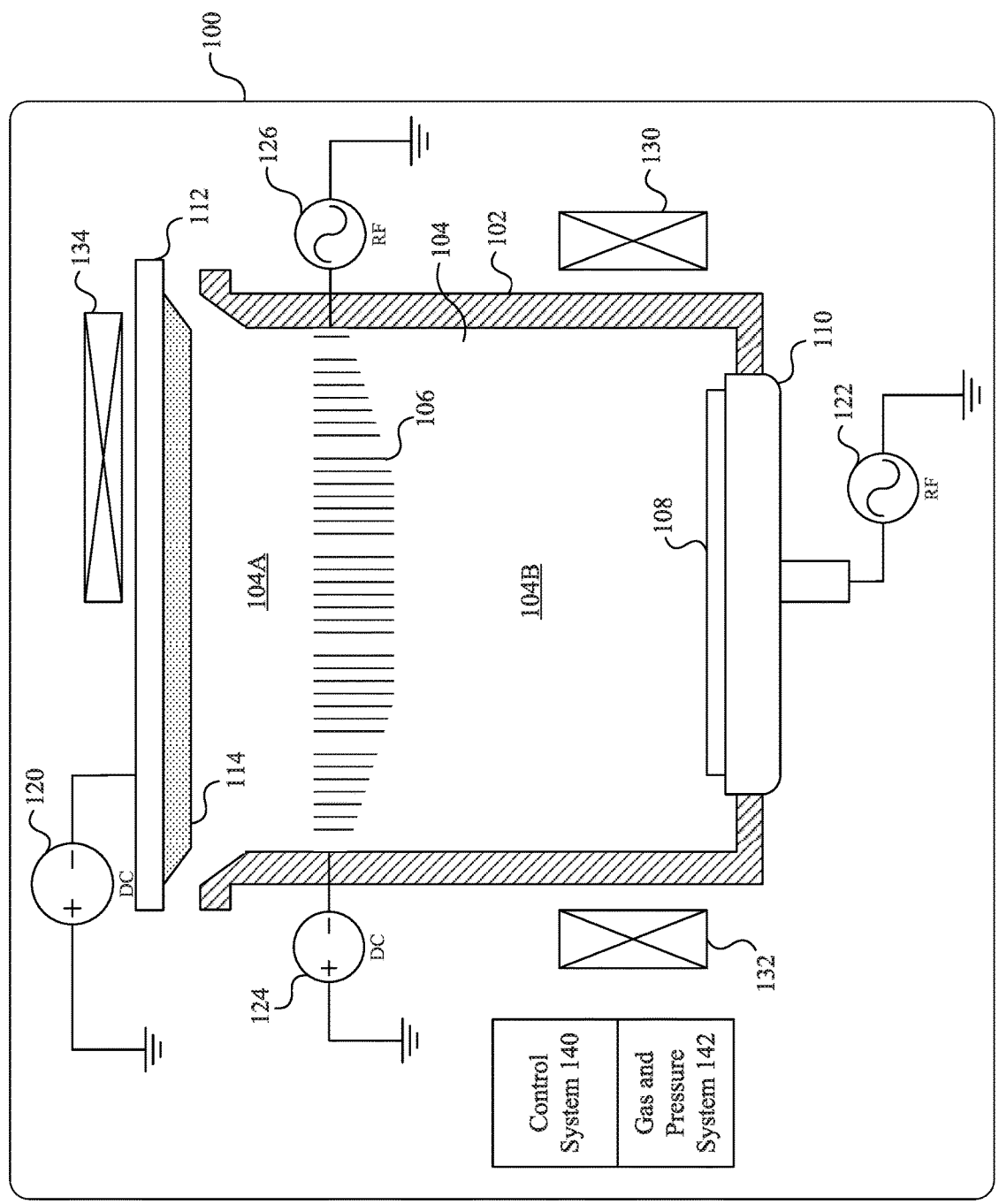
FIG. 1 is a cross-sectional diagram of a material layer deposition chamber according to aspects of the present disclosure.

Referring now to FIG. 1, a physical vapor deposition system 100 that is capable of performing both deposition and etch processes is illustrated in cross-section. The deposition chamber 100 has a containment shield 102 that forms a chamber 104, including an upper chamber or portion 104A and a lower chamber or portion 104B. The upper and lower portions 104A and 104B are separated by a collimator 106. The collimator 106 is a structure that serves to channel sputtered atoms or molecules by limiting the available paths from a target 114 to a wafer 108 undergoing processing. The collimator 106 is open on top and on the bottom, and comprises a plurality of channels therethrough, the dimensions and geometry of the channels limiting available paths to material passing through the collimator. In some embodiments, individual channels may be hexagonal as seen from above, giving a "honeycomb" pattern to the collimator 106. Other embodiments of the collimator may have other shapes and patterns.

The wafer 108 is supported and brought into position in the lower chamber 104B by a wafer pedestal 110. In some embodiments, the wafer pedestal 110 is an electrostatic chuck, or e-chuck. Clamps (not depicted) may be positioned over the edges of the wafer 108 to help secure it in place. The wafer pedestal 110 may have a temperature control and maintenance system incorporated therein that allows the a temperature of the wafer 108 to be controlled. For example, the wafer pedestal 110 may be used to cool the wafer 108 as the chamber 104 may be heated for and by the production of a plasma therein. Regulating the temperature of the wafer 108 may improve characteristics of the deposited material layer and increase the deposition rate by promoting condensation.

Opposite the wafer 108 and the wafer pedestal 110 and above the upper chamber 104A there is a target carrier structure 112 that supports a target 114. The target carrier structure 112 secures the target 114 during operation of the deposition system 100. The target 114 is a piece of material from which the material layer on the wafer 108 is to be formed. The target 114 may be a conductive material, an insulating material, or may be a precursor material that reacts with a gas to form a molecule from which the deposited material layer is made. For example, a metal oxide or metal nitride may be deposited using a metal target 114 that does not include oxygen or nitrogen.

A number of power supplies are provided in the deposition system 100 in order to generate and control the plasma within the chamber 104 and to direct the sputtering and etching, or resputtering, as desired. A direct current (DC) power supply 120 is coupled to the target carrier structure 112 to supply DC power to it. A radiofrequency alternating current (RF) power supply 122 is coupled to the wafer pedestal 110. In some embodiments, an RF power supply is also provided to the target carrier structure 112 in addition to the DC power supply 120. Additionally, at least one power supply is provided to the collimator 106. In the illustrated embodiment, a DC power supply 124 and an RF power supply 126 are both coupled to the collimator 106.

As illustrated, both the target 114 and the collimator 106 are made from the same material, copper. In conventional deposition systems, collimators, when present, are usually made from aluminum or stainless steel. In some embodiments, the collimator 106 may be made from an interior core structure with a layer of copper deposited thereon, in others, the collimator 106 is formed entirely from copper.

As illustrated in FIG. 1, the deposition system 100 further includes a number of magnets. The magnets may include lateral magnets 130 and 132. The lateral magnets 130 and 132 are positioned within the deposition system 100 outside the containment shield 102 and may be coil magnets. Additionally, a magnetron 134 is provided over the target carrier structure 112. The magnetron 134 provides a magnetic field to the chamber 104, particularly the upper chamber 104A, that can facilitate the control and use of the plasma.

In use, the deposition system 100 can be used for sputtering deposition and for resputtering or etching. For example, during a deposition process, the collimator 106 may be used as a sputtering target, instead of the target 114. To do this, the DC power supply 120 may be turned off to supply no power to the target 114. An RF bias is applied to the wafer pedestal 110. This RF bias may be less than about 500 W. RF and DC power is supplied to the collimator 106 by the RF power supply 126 and the DC power supply 124. In some instances, only the RF power is supplied to the collimator 106. Thus, the DC power supply 124 may supply from 0 to about 10 kW. The RF power supplied to the collimator is about 1 kW or more.

The power provided by the DC and RF power supplies is controlled by a control system 140, which includes one or more processors in communication with memory. The memory may include process recipes that are pre-programmed for use in device fabrication. The memory may contain instructions that describe and implement the recipes. The processors are communicatively coupled to the power supplies and to a plurality of sensors in the deposition system 100. The sensors may include temperature sensors, pressure sensors, position sensors, field sensors, and others.

During the sputtering process, the pressure within the chamber 104 is maintained at a low level. For example, the pressure may be in a range from about 10 to about 150 mTorr. A gas and pressure system 142 is included as part of the deposition system 100. The gas and pressure system 142 includes valves, conduits, and pressure and flow sensors to control pressure within the chamber 104, to introduce reactant gases, and to remove exhaust gases. The gas and pressure system 142 is in communication with the control system 140.

During this sputtering process Ar+ ions may be used to free copper atoms from the collimator 106 to condense on the wafer 108.

The deposition system 100 may also be used for etching or resputtering using metal ions, such as copper ions. This may be done by using the control system 140 to set the DC supply 120 to provide about 20 kW or more to the target carrier structure 112 and the target 114. The DC and RF power supplies 124 and 126 may be turned off so that no power is supplied to the collimator 106. And the RF bias applied by the RF power source 122 to the wafer pedestal 110 is more than about 500 W. Thus, the collimator 106 may function as a collimator only, and not as a collimator and target during a metal ion etch process, such as a copper ion etch process. The pressure maintained in the chamber 104 by the gas and pressure system 142 is less than about 1 mTorr.

Both the deposition process and the resputtering process may be used in the formation of a single material layer on the wafer 108. By enabling both processes in the deposition system 100, the material layer formed therein may provide improved feature coverage. For example, the deposition system 100 may provide for thick coverage at the bottom of narrow trench features and good sidewall coverage. The resputtering process may use the metal ions to improve the sidewall coverage while limiting profile damage.

Figure 2:
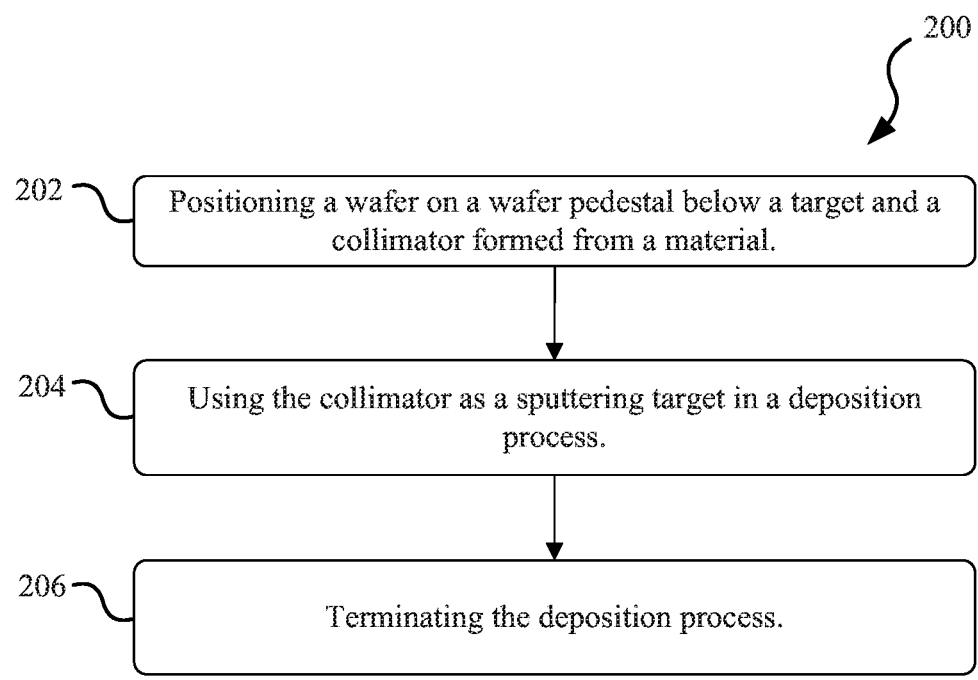
FIG. 2 is a flowchart of a method depositing a material layer on a semiconductor wafer according to aspects of the present disclosure.

FIG. 2 is a flowchart of a method 200 of depositing a material layer on a semiconductor wafer. As illustrated, the method 200 includes several enumerated steps. However, embodiments of the method 200 may include additional steps before, after, in between, and/or as part of the enumerated steps. The illustrated embodiment of method 200 begins in step 202 in which a wafer is positioned on a wafer pedestal below a collimator formed from a material and below a target. In step 204, the collimator is used as a sputtering target in a deposition process. The deposition process uses the collimator to provide the material for the material layer. In step 206, the deposition process is terminated.

To better describe the method 200, reference is made herein to the deposition system 100 of FIG. 1. For example, the wafer pedestal 110 is used to position the wafer 108 in the bottom of the chamber 104, below both the collimator 106 and the target 114, which is attached to the target carrier structure 112. The control system 140 directs at least one of the DC power supply 124 and the RF power supply 126 to supply electrical power to the collimator 106. This causes the collimator 106 to function as a target such that material from the collimator is freed and then condenses on the wafer 108 by ions formed within a plasma.

In some embodiments, the collimator 106 and the target 114 may be used in a deposition process. In such embodiments, the collimator 106 and the target 114 may be used simultaneously as a target or the collimator 106 and the target 114 may be used sequentially in depositing a material layer. This may include supply RF power and/or DC power to the target 114 during the deposition process.

When a desired amount of material is deposited onto the wafer 108, the deposition process may be terminated. In order to improve the sidewall coverage of features, such as trenches, that are present on the wafer 108, a metal ion etch process, or resputtering process, may be started by the control system 140. As part of the metal ion etch process, the power supplies 124 and 126 coupled to the collimator 106 may be turned off so that no power is applied thereto. Instead, DC power is applied to the target 114 by the DC power supply 120, which is coupled to the target carrier structure 112. During the resputtering, an RF bias of greater than 500 W is applied to the wafer pedestal 110, while an RF bias of less than 500 W is applied during the deposition.

The steps of the method 200 are performed in a single deposition chamber that is part of the deposition system 100. The dual-mode deposition system may provide improved coverage at the bottom and on the sidewalls of features having critical dimensions of about 20 nanometers or less. The profile of the material layer may be generally maintained by the use of the metal ions during the resputtering process.

In one exemplary aspect, the present disclosure is directed to a material layer deposition chamber. The deposition chamber includes a confinement shield structure, a wafer pedestal configured to support at least one wafer within the confinement shield structure, and a target carrier structure positioned above the wafer pedestal at an opposite side of the confinement shield structure. The target carrier structure is configured to support a sputtering target. The deposition chamber further includes a collimator disposed within the confinement shield structure between the wafer pedestal and the target carrier structure with an electrical power source coupled to the collimator to supply electrical power.

In another exemplary aspect, the present disclosure is directed to a material layer deposition system. The material layer deposition system includes a wafer pedestal configured to support at least one wafer within a confinement shield structure and a target carrier structure positioned above the wafer pedestal at an opposite side of the confinement shield structure. The target carrier structure is configured to support a sputtering target. The material layer deposition system further includes a collimator disposed within the confinement shield structure between the wafer pedestal and the target carrier structure, an electrical power source coupled to the collimator to supply electrical power, and a control system configured to control the electrical power source coupled to the collimator.

In yet another exemplary aspect, the present disclosure is directed to a method of depositing a material layer on a semiconductor wafer. The method includes steps of positioning a wafer on a wafer pedestal below a collimator formed from a material and below a target, of using the collimator as a sputtering target in a deposition process, and terminating the deposition process. The collimator provides the material for the material layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition system comprising:
a target;
a collimator;
a power source system configured to supply power to the collimator and the target; and
a control system configured to control the power source system, such that the collimator is bombarded with noble gas ions during a sputtering process and a material layer of a wafer is bombarded with metal ions during a re-sputtering process, wherein the collimator functions as a sputtering target during the sputtering process and as the collimator during the re-sputtering process.

2. The physical vapor deposition system of claim 1, wherein the noble gas ions include argon and the metal ions include copper.

3. The physical vapor deposition system of claim 1, wherein the power source system includes:
a radiofrequency (RF) power source coupled to the collimator;
a direct current (DC) power source coupled to the target; and
wherein the control system is further configured to set the power source system to supply RF power to the collimator via the RF power source during the sputtering process and supply DC power to the target via the DC power source during the re-sputtering process.

4. The physical vapor deposition system of claim 1 configured to generate a plasma that includes the noble gas ions during the sputtering process and the metal ions during the re-sputtering process, and further wherein the power source system is configured to control the plasma by supplying the power to the collimator during the sputtering process and supplying the power to the target during the re-sputtering process.

5. The physical vapor deposition system of claim 4, further comprising at least one magnet configured to control the plasma.

6. The physical vapor deposition system of claim 1, further comprising a wafer pedestal configured to support the wafer, wherein the power source system includes a radiofrequency power source coupled to the wafer pedestal, and further wherein the power source system is configured to supply a first radiofrequency bias to the wafer pedestal via the radiofrequency power source during the sputtering process and a second radiofrequency bias to the wafer pedestal via the radiofrequency power source during the re-sputtering process, wherein the first radiofrequency bias is less than the second radiofrequency bias.

7. The physical vapor deposition system of claim 1, further comprising a pressure system in communication with the control system, wherein the pressure system is configured to maintain a first pressure in the physical vapor deposition system during the sputtering process and a second pressure in the physical vapor deposition system during the re-sputtering process, wherein the first pressure is greater than the second pressure.

8. The physical vapor deposition system of claim 1, wherein the target and the collimator include a same material.

9. A physical vapor deposition system comprising:
a copper-containing target;
a copper-containing collimator;
a power source system configured to supply power to the copper-containing collimator and the copper-containing target; and
a control system configured to control the power source system, such that:
during a sputtering process, the copper-containing collimator is bombarded with ions when no power is supplied to the copper-containing target, and
during a re-sputtering process, a material layer is bombarded with ions when no power is supplied to the copper-containing collimator.

10. The physical vapor deposition system of claim 9, wherein the copper-containing collimator is bombarded with argon ions and the material layer is bombarded with copper ions.

11. The physical vapor deposition system of claim 9, configured to generate a plasma that includes the ions during the sputtering process and the ions during the re-sputtering process, and further wherein the power source system is configured to control the plasma by supplying the power to the copper-containing collimator and the copper-containing target.

12. The physical vapor deposition system of claim 11, further comprising at least one magnet configured to control the plasma.

13. The physical vapor deposition system of claim 9, wherein the copper-containing collimator includes a copper-containing layer disposed over an interior core.

14. A method comprising:
positioning a wafer in a physical vapor deposition system that includes a collimator disposed between the wafer and a target;
during a sputtering process in the physical vapor deposition system, bombarding the collimator with noble gas ions, thereby causing material from the collimator to condense on the wafer; and
during a re-sputtering process in the physical vapor deposition system, bombarding the condensed collimator material with metal ions, thereby re-sputtering a portion of the condensed collimator material on the wafer.

15. The method of claim 14, wherein the noble gas ions include argon and the metal ions include copper.

16. The method of claim 14, further comprising supplying radiofrequency power to the collimator during the sputtering process and direct current power to the target during the re-sputtering process.

17. The method of claim 16, further comprising supplying direct current power to the collimator during the sputtering process.

18. The method of claim 14, further comprising turning power to the collimator on and power to the target off during the sputtering process and turning the power to the collimator off and the power to the target on during the re-sputtering process.

19. The method of claim 14, further comprising maintaining a first pressure in the physical vapor deposition system during the sputtering process and a second pressure in the physical vapor deposition system during the re-sputtering process, wherein the first pressure is greater than the second pressure.

20. The method of claim 14, wherein the physical vapor deposition system further includes a wafer pedestal configured to support the wafer, the method further comprising applying a first radiofrequency bias to the wafer pedestal during the sputtering process and a second radiofrequency bias to the wafer pedestal during the re-sputtering process, wherein the first radiofrequency bias is less than the second radiofrequency bias.

* * * * *